United States Patent
Russell et al.

(10) Patent No.: US 9,652,565 B2
(45) Date of Patent: May 16, 2017

(54) SYSTEM AND METHOD FOR PRODUCING DISPLAY OF PETROPHYSICAL PROPERTY HEIGHT PROFILE FOR BOTH VERTICAL AND HORIZONTAL WELLBORES

(71) Applicant: Saudi Arabian Oil Company, Dhahran (SA)

(72) Inventors: Steven Duffy Russell, Dhahran (SA); Muhammad Razi B. Abu-Bakar, Ras Tanura (SA); Khalid S. Al-Wahabi, Dammam (SA)

(73) Assignee: Saudi Arabian Oil Company, Dhahran (SA)

( * ) Notice: Subject to any disclaimer, the term of this patent is extended or adjusted under 35 U.S.C. 154(b) by 438 days.

(21) Appl. No.: 13/914,777

(22) Filed: Jun. 11, 2013

(65) Prior Publication Data
US 2013/0332131 A1    Dec. 12, 2013

Related U.S. Application Data

(60) Provisional application No. 61/658,106, filed on Jun. 11, 2012.

(51) Int. Cl.
*G06F 7/48*    (2006.01)
*G06F 17/50*    (2006.01)
*G01V 1/50*    (2006.01)
*G01V 1/34*    (2006.01)

(52) U.S. Cl.
CPC ............ *G06F 17/5009* (2013.01); *G01V 1/50* (2013.01); *G01V 1/345* (2013.01); *G01V 2210/6246* (2013.01)

(58) Field of Classification Search
CPC ...... G06F 17/5009; G01V 1/50; G01V 1/345; G01V 2210/6246
USPC .................................................. 703/10; 702/6
See application file for complete search history.

(56) References Cited

U.S. PATENT DOCUMENTS

| | | | |
|---|---|---|---|
| 7,711,532 B2 * | 5/2010 | Dulac | G01V 11/00 702/11 |
| 2011/0320182 A1 * | 12/2011 | Dommisse | G01V 1/34 703/10 |

OTHER PUBLICATIONS

Kumar et al. "A New Method for Gas Well Deliverability Potential Estimation Using MiniDST and Single Well Modeling: Theory and Examples". SPE 113650. 2008. 11 Pages.*

* cited by examiner

*Primary Examiner* — Eunhee Kim
(74) *Attorney, Agent, or Firm* — Fish & Richardson P.C.

(57) ABSTRACT

A computerized system creates and communicates to a user a wellbore property-height profile of a selected property, such as permeability, at each cell location defining the wellbore. The property-height value is determined based on a "summation from base" algorithm. The system may also be used to create a property-height profile in horizontal and slant wells, by creating a plurality of vertical pseudo-wells which intersect the trajectory of the horizontal or slant well.

6 Claims, 12 Drawing Sheets

SLANT/HORIZONTAL WELL
- USER TO HAVE PERM AND CELL HEIGHT MODELS
- MULTIPLICATION OF K AND H IN 3D GRIDS
- IDENTIFY CELL COLUMNS (BY I AND J)-IN 3D GRID
- MAKE SYNTHETIC LOGS OF KH FROM INDIVIDUAL CELL COLUMN
- STACK SYNTHETIC LOGS INTO A SINGLE KH LOG
- SUM AND ACCUMULATE SUM FROM SINGLE KH LOG TO CREATE PROFILE

HOW TO MAKE KH LOG (ON EACH CELL COLUMN)
1. SCALE UP PERM LOG (SD PERM, FAL OR FACIMAGE PERM)
2. MAKE CELL HEIGHT MODEL (GEOMETRICAL MODELING)
3. CALCULATE KH USING CALCULATOR
   KH = PERM* CELL HEIGHT
4. MERGE/STACK RESULTS INTO A COMPOSITE WELL
5. SUM KH VERTICALLY (ACCUMULATE SUM, ACCUMULATE FROM BASE)

SYSTEM AND METHOD FOR PRODUCING DISPLAY OF PETROPHYSICAL PROPERTY HEIGHT PROFILE FOR BOTH VERTICAL AND HORIZONTAL WELLBORES

CROSS-REFERENCE TO RELATED APPLICATIONS

The present application claims priority on U.S. provisional patent application No. 61/658,106, filed on Jun. 11, 2012, the disclosure of which is incorporated by reference.

BACKGROUND OF THE INVENTION

The present invention relates to the field of 3D property modeling and simulation of an oil reservoir. Such models use computer software and various field measurements to predict various properties of the reservoir, such as the presence of oil and its ability to flow. Developing a 3D mapping of the wellbore is considerably less expensive than performing actual wellbore testing.

Large amounts of capital are spent every year drilling, evaluating, testing and completing new oil and gas wells. The elimination of unnecessary data gathering and the gathering of necessary additional information is often the subject of disagreements when decisions are being made throughout the drilling/exploration process. The tendency is to over-purchase new technologies with the assumption that a better answer can be reached.

The identification and evaluation of hydrocarbon productive intervals such as oil and gas reservoirs in a formation traversed by a well bore or borehole have historically been done by lowering instruments into a well and measuring petrophysical parameters such as formation resistivity and density. During the drilling, borehole samples from the formation are collected by a process called core sampling. These samples are then analyzed in laboratories and various parameters are measured to determine petrophysical properties.

The results of these measurements are then numerically processed using empirical relationships in order to calculate water saturation, porosity and permeability, which describe key formation properties. These variables are key indicators of hydrocarbon volume and hydrocarbon productivity, respectively. Based on these values, petrophysicists use their experience to make a judgment and to determine the potential presence of commercial hydrocarbons.

There are currently a number of reservoir computer modeling programs available, such as the Petrel modeling software marketed by Schlumberger. Such modeling programs divide the reservoir into a large number of three-dimensional cells. Using data obtained from logging tools along with seismic measurements and rock core sample analysis, the programs perform mathematical analyses to estimate the permeability, porosity, water saturation, and other properties for each cell.

One of the measures of flow capacity of a well is the value of porosity times cell height, or KH. KH profile logs have been modeled successfully with vertical wellbores to predict flow characteristics in a wellbore. Today, many wellbores contain both vertical and horizontal or slanted wellbores. It has been found that existing modeling techniques used in vertical wellbores do not produce accurate KH profiles when applied to high-slant and horizontal wellbores. It would be desirable to provide the ability to be able accurately to generate 3D models for any type of wellbore including horizontal and slant wellbores.

SUMMARY OF THE INVENTION

The present invention is a system for creating a property height-profile for a well. The system is particularly directed to creating a permeability-height (KH) profile using a novel algorithm. The system can be used not only with vertical wells but also to create accurate KH profiles in slant/horizontal wells. The system software may be stored in a plug-in device that works with other reservoir modeling software such as the Petrel program sold by Schlumberger. Profiles created by the system have been compared extensively against KH profiles created based on well tests and provide consistent results.

Because well tests are costly and are available only in selected wells, the present invention provides a way to generate KH profiles for all wells inexpensively. In addition to reducing costs, KH data can now be modeled as a property, meaning that calculated KH values in each well can be populated/distributed in a 3D space model to predict KH away from the well trajectory. Moreover, the iterative capability of the KH process provides the opportunity for geologists and engineers to test KH scenarios through variable permeability model realization. In other words, the process of calculating and profiling KH can be done repeatedly until the results closely match actual data measured in the field by wireline/logging companies. When the prediction from a 3D model is approaching actual measured data, confidence that the model will accurately predict data in areas away from the well that is modeled in 3D space is increased.

The invention takes permeability (K) log measured by wireline/logging companies and user-defined cell heights (H) to produce KH profiles that represent flow quality and contribution in a well. In other words, the invention may use field measurements as well as predicted permeability from the geomodel. Field measurements of permeability are used to calibrate the geomodel. The invention can then be used to predict outcomes from unmeasured wells.

DETAILED DESCRIPTION OF EMBODIMENTS OF THE INVENTION

Figure 1:
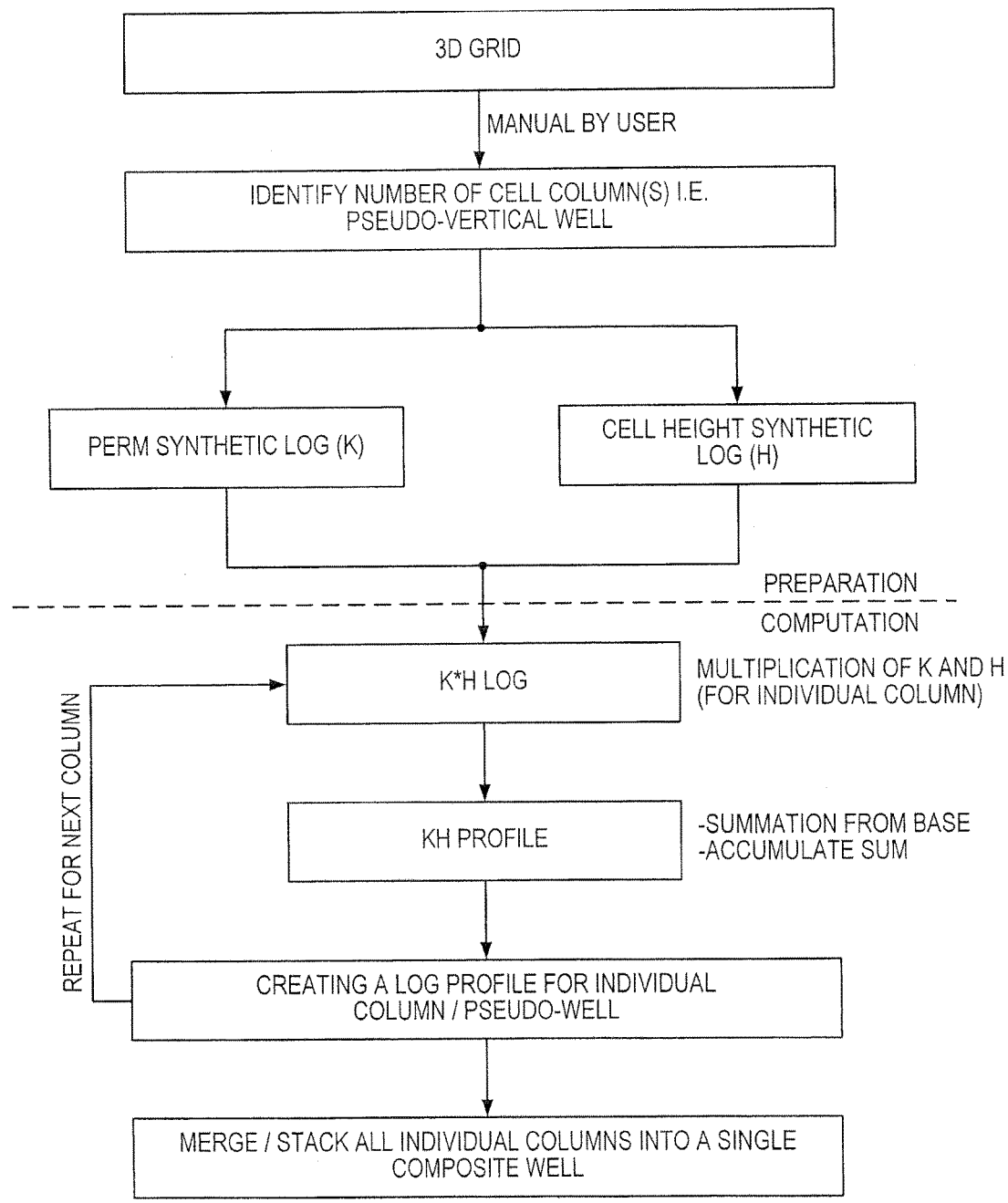
FIG. 1 is a flow schematic showing the method of formulating a 3D property height profile, in particular of flow characteristics based on K×H, for a horizontal pseudo-well, according to the invention.

FIG. 1 is a flow diagram showing the computer implemented algorithm of the present invention. The user first defines a 3-dimensional grid for the reservoir. Each cell in the grid has a defined length, width, and vertical height. The present invention is preferably utilized as a plug-in application for a computer system programmed with 3-dimension mapping software, such as that contained in the Petrel program. Such programs typically have already established a 3-dimensional grid for the oil reserve during the mapping process. If not, the user defines the number of columns and the cell height to be used in the grid. Alternately, the present invention may be used as part of a 3D mapping program.

FIG. 1 is used to property-height profile for a vertical pseudo-well. The computer first identifies the particular vertically stacked cells which define the vertical pseudo well. It then creates a synthetic permeability log of the estimated permeability of each cell. Such estimated value is retrieved from the mapping previously done on the reservoir. Similarly, the program generates a corresponding synthetic log for the height of each column.

For each cell location, the program multiplies the value of estimated permeability by the cell height, to obtain a KH profile. The result is added to the previous value of KH, and stored as the value for such cell. As indicated, such summation is from the base, meaning that the profiling is done starting with the lowest cell in the grid. The result is a KH profile which indicates the likelihood of oil flow at each cell location.

Figure 3:
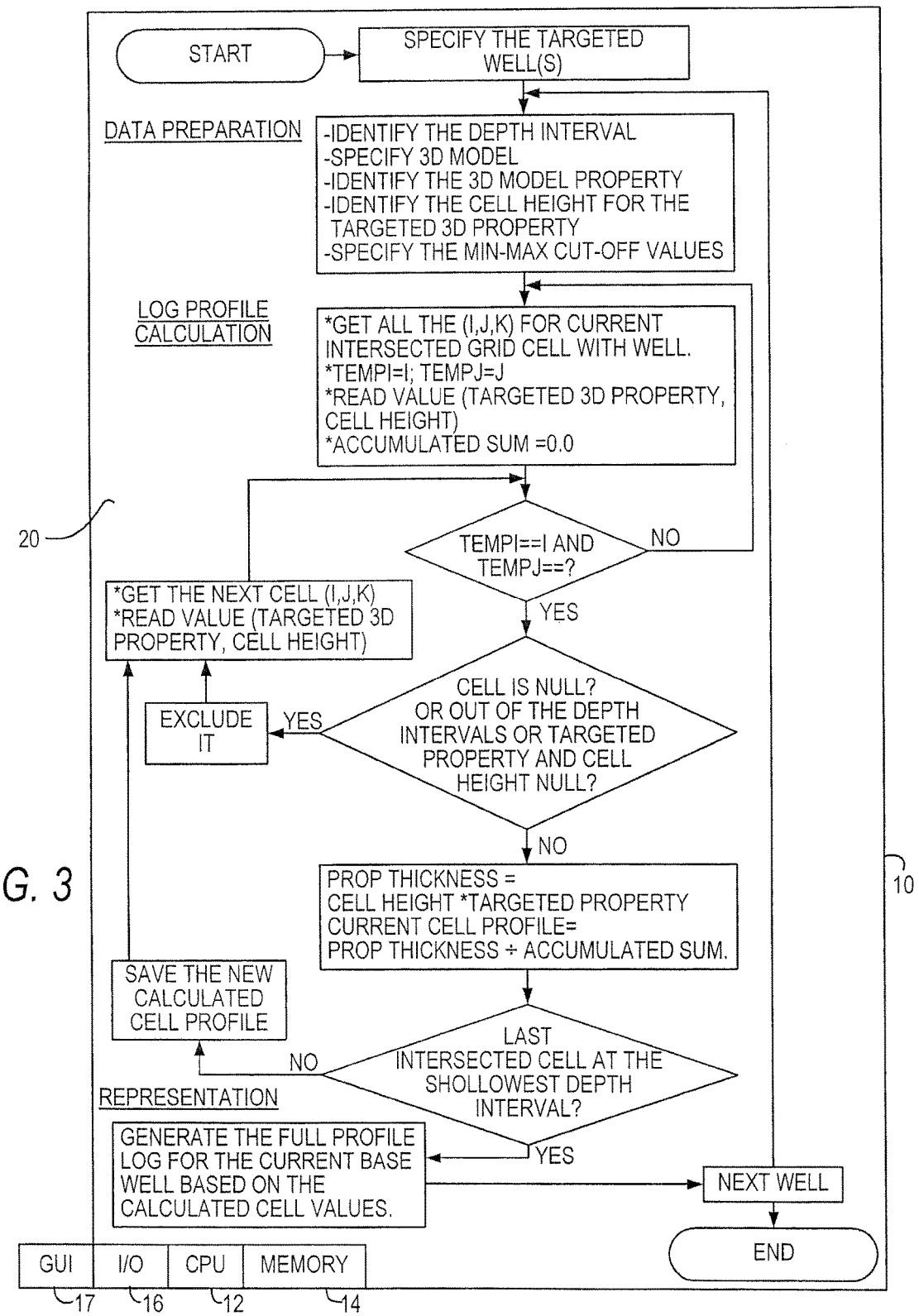
FIG. 3 is a schematic drawing of a computer system which has been programmed to implement the flow diagram shown.

Such process is shown in greater detail in FIG. 3. The box is a schematic of a computer 10 which includes a processor 12, memory 14, and input/output communications hardware 16. The computer 10 may be a general purpose computer or a specially programmed computer. As configured, the computer 10 is programmed with modeling software such as Petrel, and also has loaded software module 20 to implement the invention. At the time that software module 20 is run, the CPU has already created a 3-dimensional model, using the stored modeling software, for the chosen well and stored the results in memory.

Initially, the operator specifies the targeted well or wells to be profiled. The operator may specify the depth interval (the selected depths at which KH values will be determined), and specify which 3-D model is to be used (if more than one model is available). Next, the operator specifies which property value is to be profiled. While the invention is primarily intended to profile permeability times cell height, it may be used to profile other properties. The operator also identifies the cell height for the targeted 3D property (which was originally created in Petrel—the invention identifies and uses the cell height to create the KH profile. The operator also specifies the I, J coordinates (i.e., the horizontal coordinates) for the vertical pseudo-well. Finally, the operator specifies minimum and maximum cutoff values of Log measured depth. At such point, the operator may launch the program.

The computer first retrieves from memory the cells corresponding to the specified I, J coordinates for the specified well. The program starts with the lowest cell in the well, i.e., the lowest height K. For the initial cell located at I, J, K, the program sets a "TempI" value to equal "I" and "TempJ" to equal "J." The CPU then retrieves the value of the targeted property, e.g., permeability, for the corresponding cell from memory, based on the reservoir model, and sets the value of an "accumulated sum" to zero.

The CPU then determines whether TempI=I and TempJ=J. If both values do not match, the CPU returns to the initial step. If both values, match, the CPU determines if the selected cell is null (i.e., has zero cell values (permeability or cell height) and therefore to be avoided in calculating KH) or out of the depth interval (the cutoff previously mentioned) or targeted property (e.g., permeability) and cell height null. If "yes," such cell is excluded from the profile.

If "no," the CPU calculates the "prop thickness" as the targeted property times the cell height. It then calculates the current cell profile as the sum of the prop thickness plus the Accumulated Sum (which, as noted above, is zero for the bottom-most cell).

Assuming that the cell is not the uppermost cell in the profile, the CPU saves the new calculated cell profile as the value for such cell. It also adds the current cell profile value to the Accumulated Sum, to become the new Accumulated Sum. The CPU then (or if the cell has been excluded), retrieves the selected 3D property and cell height values for the next cell (located at the next height location K1) and repeats the process.

Figure 2:
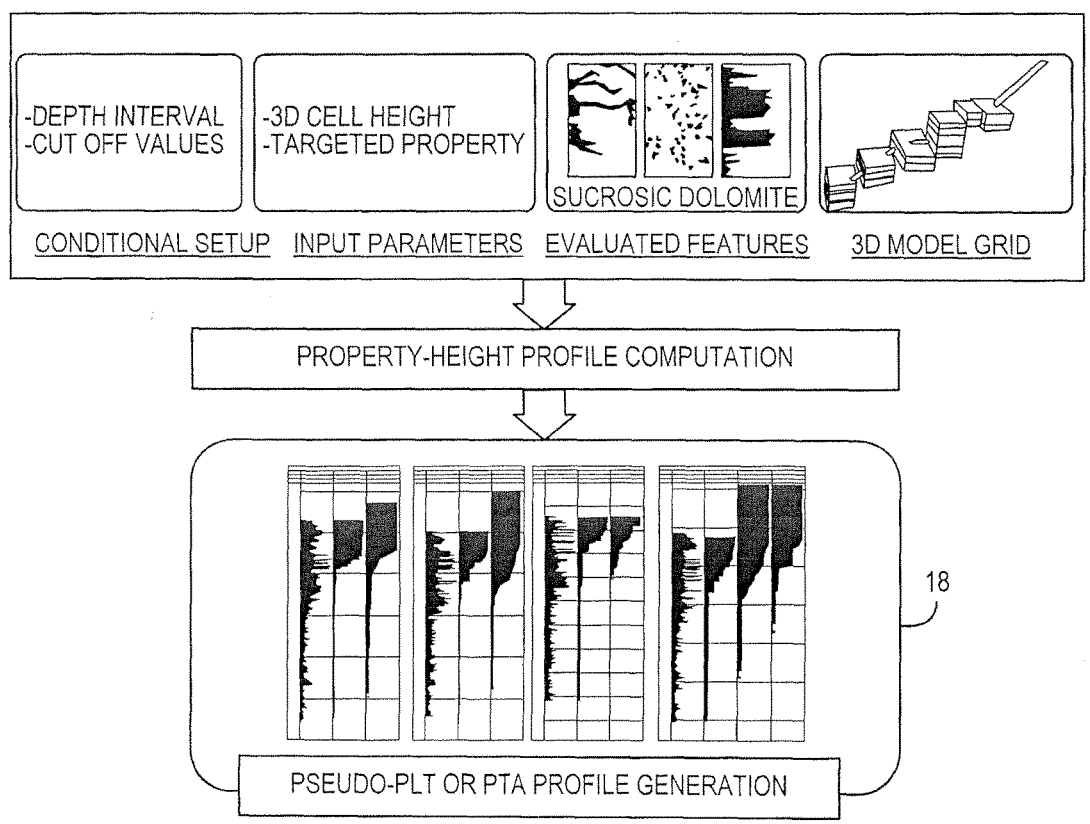
FIG. 2 is a schematic representation of the profile process carried out by the present invention.

Once the CPU reaches the uppermost, i.e., shallowest, cell, the program generates the full profile log for the current well based on the calculated values for each cell in the vertical pseudo wellbore. The results may be displayed on a computer screen 18, as shown in FIG. 2, or printed.

When the model is first used in a reservoir, the estimated values of KH obtained from the model may be compared with values obtained from production logging tools, and the model adjusted accordingly in an iterative process. Preferably, the model is adjusted by adjusting the perm log in individual wells and regenerating the perm model in Petrel.

The procedure for obtaining a property profile for horizontal wells (which, in the present application, also means slant wells), is more complex and described below.

Returning to FIG. 1, when the process is to be used for horizontal or slant wells, as indicated the operator selects the cell columns where vertical pseudo-wells are to be created. The number and location of the pseudo-wells selected is a direct function of complexity inclination, length, shape etc.) of the trajectory of the horizontal well to be modeled. The more complex the well, the more vertical pseudo-wells are needed. The term "cell column" refers to the number of data points (i.e., stacked cells) which intersect the particular vertical pseudo-well.

The invention takes a selected property, such as permeability, in a given well and creates a profile log of the property summed from the base of the well, i.e., in essence calculating the integral value. The property-height profile is a useful tool to identify layers or zones within the well which contribute the greatest values of the property. Such a property-height profile is particularly useful when applied to permeability, which relates to flow and reservoir fluid dynamics.

Initially, it was determined that the algorithm currently used to obtain KH profiles in vertical wells did not accurately predict the KH profile in a horizontal well. We developed a new concept for determining a KH profile in a vertical well. Once it was proven successful, we applied it to horizontal wells using the same new algorithm, where it proved to be successful as well.

The invention uses conventional logging data in the form of standard wireline log measurements acquired by the logging company during drilling and data acquisition phase of forming the borehole, along with core and image-derived permeability (from the borehole image log, in the form of resistivity, acquired by the logging company in a borehole converted to permeability log using a mathematical equation), to identify and quantify permeability in uncored wells. Typically, logging data (especially PLT exist only in several wells, not all. The data were used in the invention to verify or correct the permeability at the well location. A 3D model of permeability or KH will be created from a "calibrated" PLT profile to predict outcomes from unmeasured wells.

Figure 4:
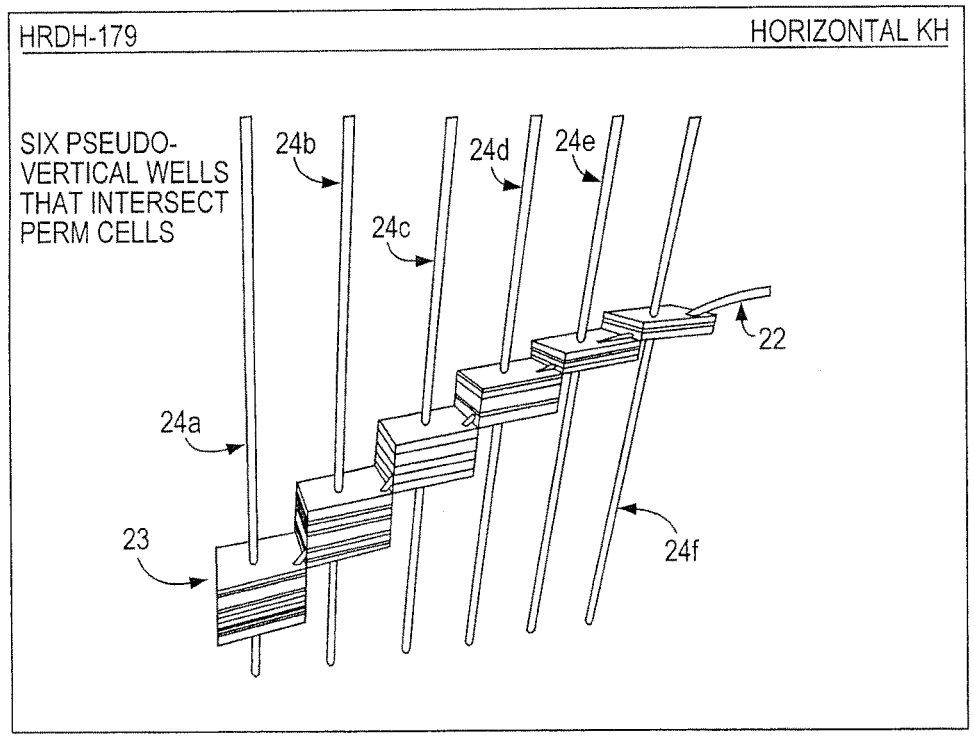
FIG. 4 illustrates an example of a horizontal wellbore, all of the 3D model cells which intersect such wellbore, and eight vertical pseudo-wells which pass through the 3D model cells for a reservoir identified as HRDH-179.
Figure 5:
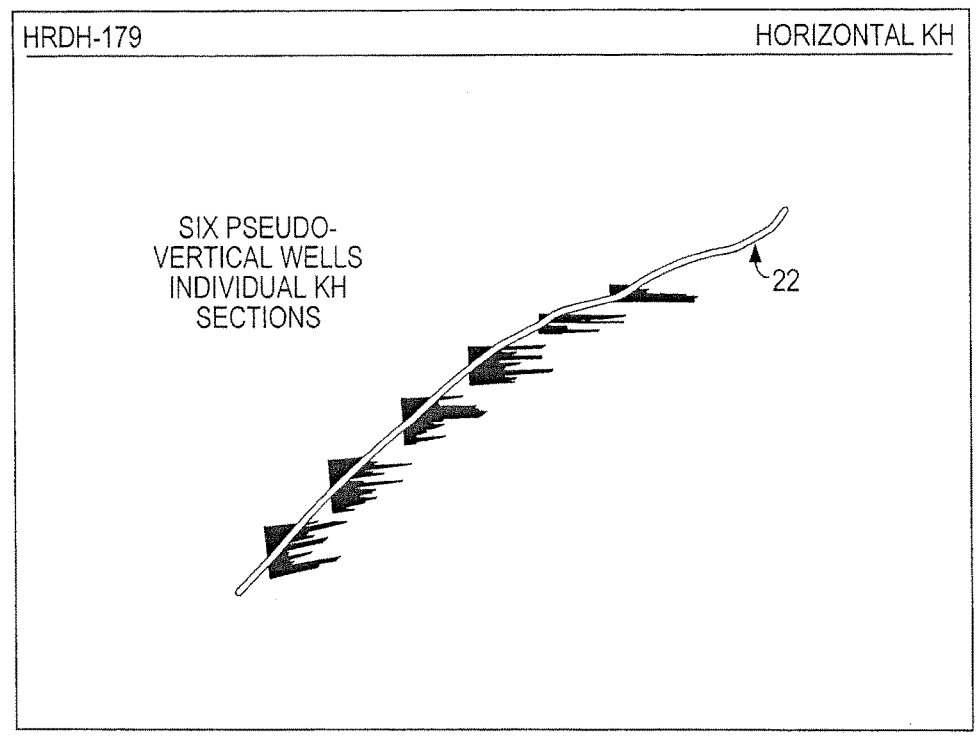
FIG. 5 shows the estimated permeability in the six pseudo-wells for the 3D cells which intersect the vertical pseudo-wells for reservoir HRDH-179.

FIGS. 4 and 5 are computer renderings showing a trajectory 22 of a horizontal wellbore. The trajectory 22 may represent the path of an actual well or a pseudo well. The path coordinates (I, J, K) are input by the operator using the system.

In order to develop a profile log, the computer determines all of the cells 23 which intersect the trajectory 22. The computer then creates vertical pseudo-wells 24a-24 such that one such well passes through each set of vertically stacked cells 23. As shown, as the incline of the trajectory 22 increases, the trajectory passes through more cells 23 than when the trajectory is more horizontal.

Once the cells 23 and vertical pseudo-wells 24a-f have been created, the computer performs the subroutine described in connection with FIG. 3 consecutively, starting with pseudo well 24a, for each pseudo-well 24a-24f, containing a calculated cell profile for each well. In creating the profile, only those cells which intersect the trajectory 22 are used. As shown in FIG. 5, the system produces modeled permeability values for each of the six pseudo-wells where they intersect the cells.

Example 1

Figure 6:
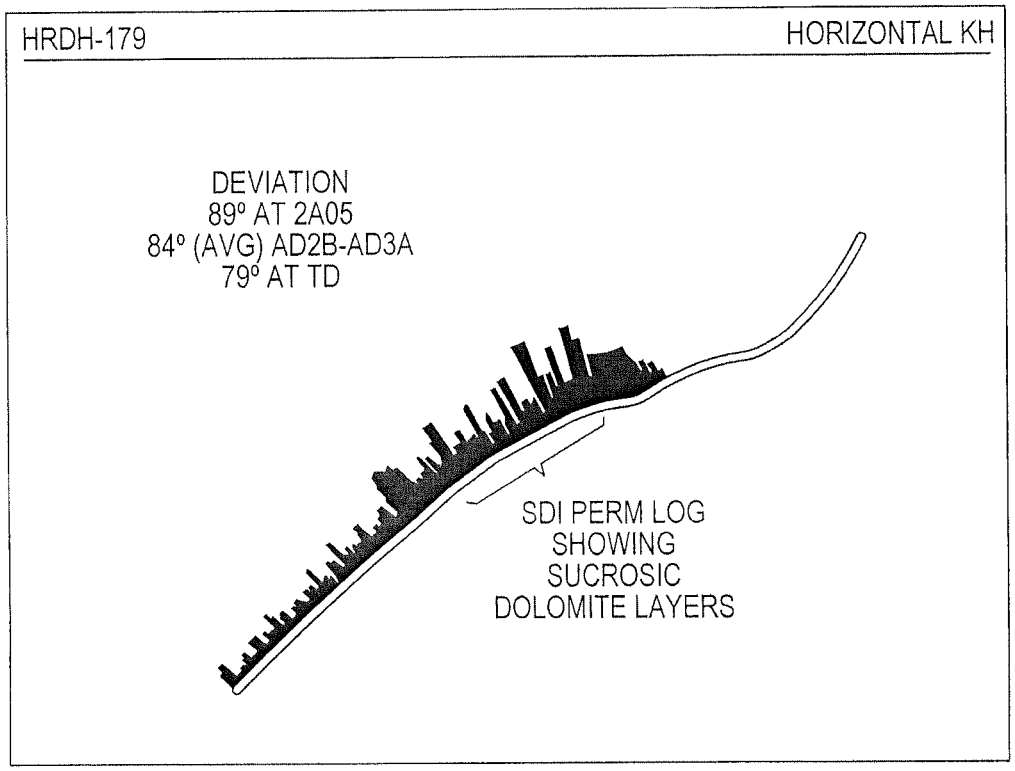
FIG. 6 shows the results of a case study on a reservoir identified as HRDH-179, based on the horizontal cells identified in FIGS. 8-9 for reservoir HRDH-179.

An initial case study was performed at a high-angle well identified as HRDH-179. Production logging tools in the well showed sucrosic dolomite layers having the permeability profile shown in FIG. 6.

Figure 7:
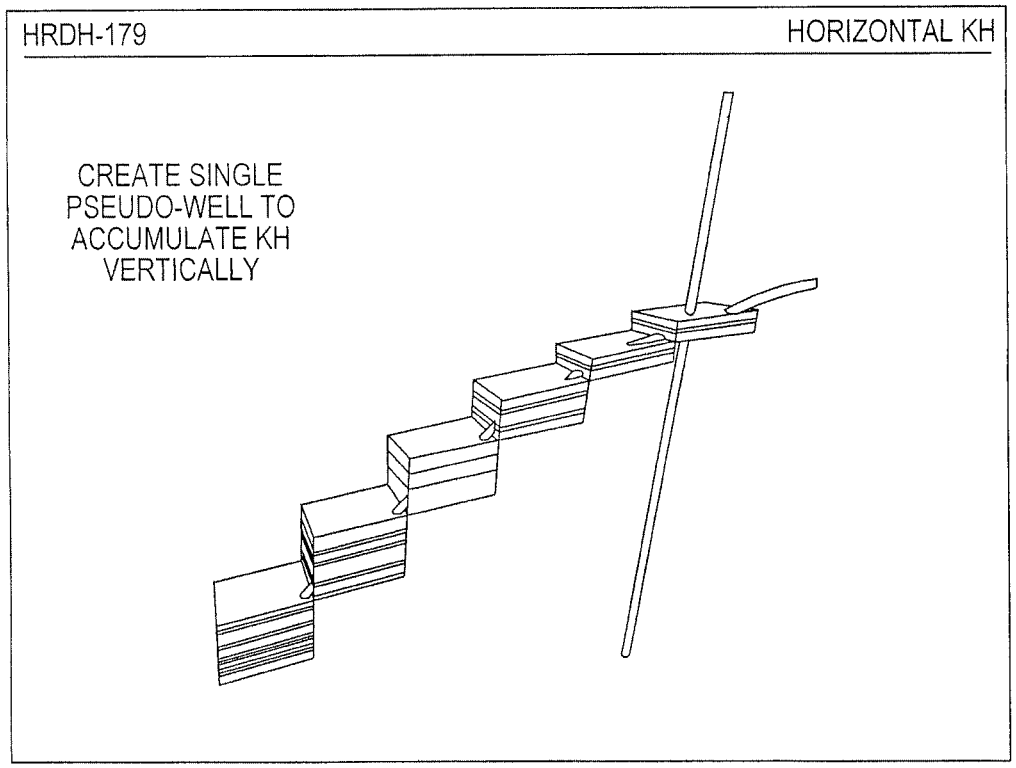
FIG. 7 shows another vertical pseudo-well, which has been created at the target entry point for reservoir HRDH-179.

FIG. 7 shows another vertical pseudo-well which has been created at the target entry point to accumulate the permeability of the six separate pseudo-wells 24a-24b. FIG. 7 is similar to FIG. 4, but with a higher well angle well and shows a step-by-step example of how KH or PLT can be plotted on a slanted horizontal well.

Figure 8:
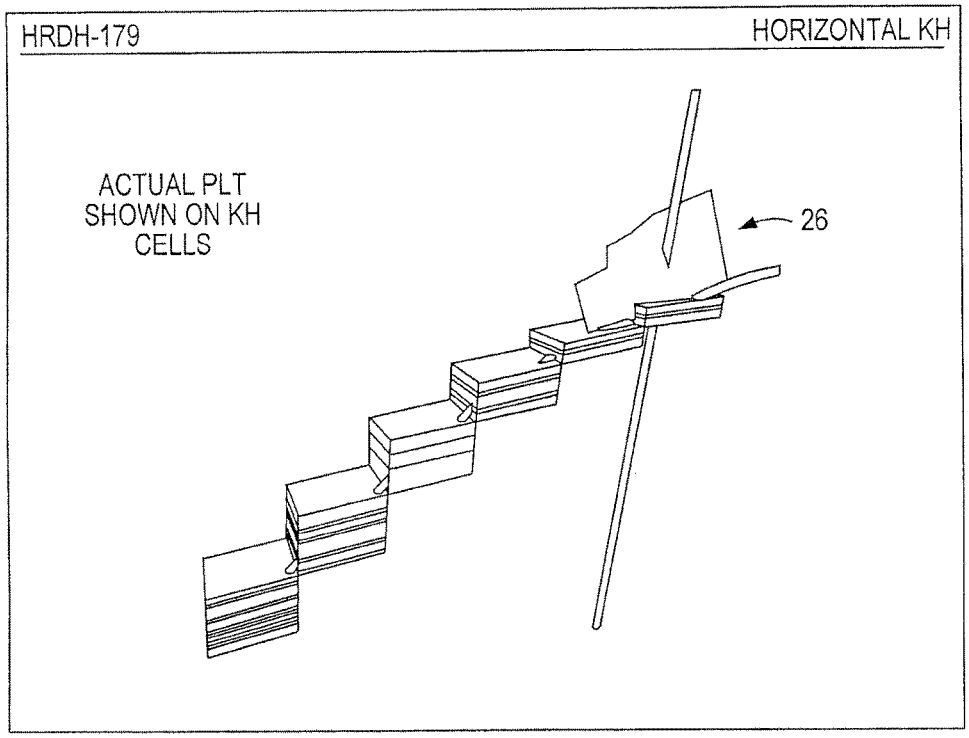
FIG. 8 shows results obtained using data from an actual flow meter, illustrating the abrupt onset of production from the second group of cells (second from the right) with high permeability for reservoir HRDH-179.

In FIG. 8, and actual flow meter 26 is represented to illustrate the abrupt onset of oil production from the cell group which is the second from the right in the drawing, representing an area of high permeability. This figure is used to demonstrate the PLT as measured in the field and it should be viewed with FIG. 9.

Figure 9:
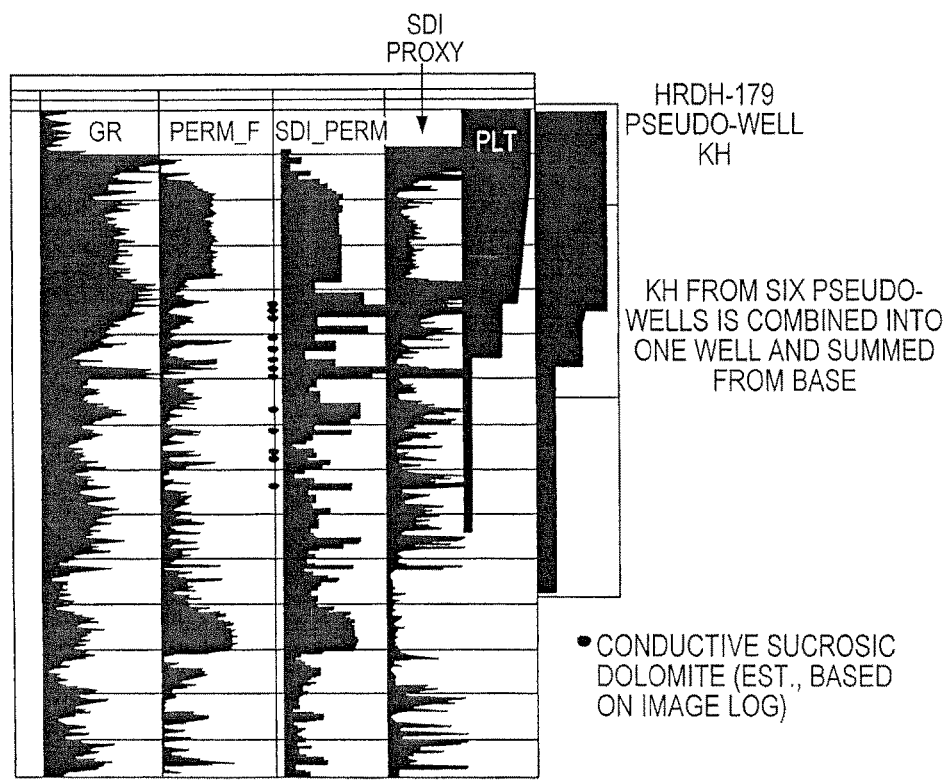
FIG. 9 is a log which shows permeability as measure by production logging tools (column labeled PLT) next to permeability as predicted using the pseudo-wells (far right) for reservoir HRDH-179.

FIG. 9 is a KH log for reservoir HRDH-179 obtained using production logging tools next to the KH profile obtained using the present invention, where permeability is summed from the base (as in FIG. 3). The results from the computer profiling match the actual results from PLT logs closely. The log also shows that the sucrosic dolomite layers with high permeability (the SDI-PERM track) account for the high contribution of production in two intervals.

Example 2

Figure 10:
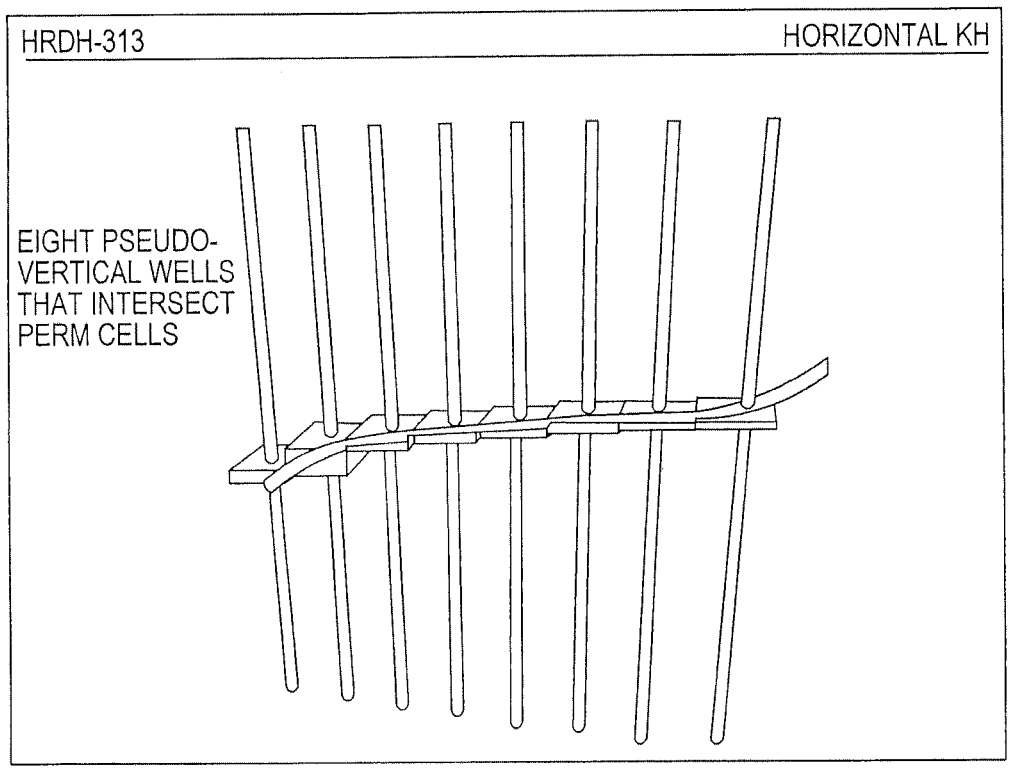
FIG. 10 illustrates schematically a horizontal wellbore trajectory, the mapping cells which intersect the wellbore trajectory, and eight pseudo vertical wells which intersect the mapping cells for a reservoir identified as HRDH-313.
Figure 11:
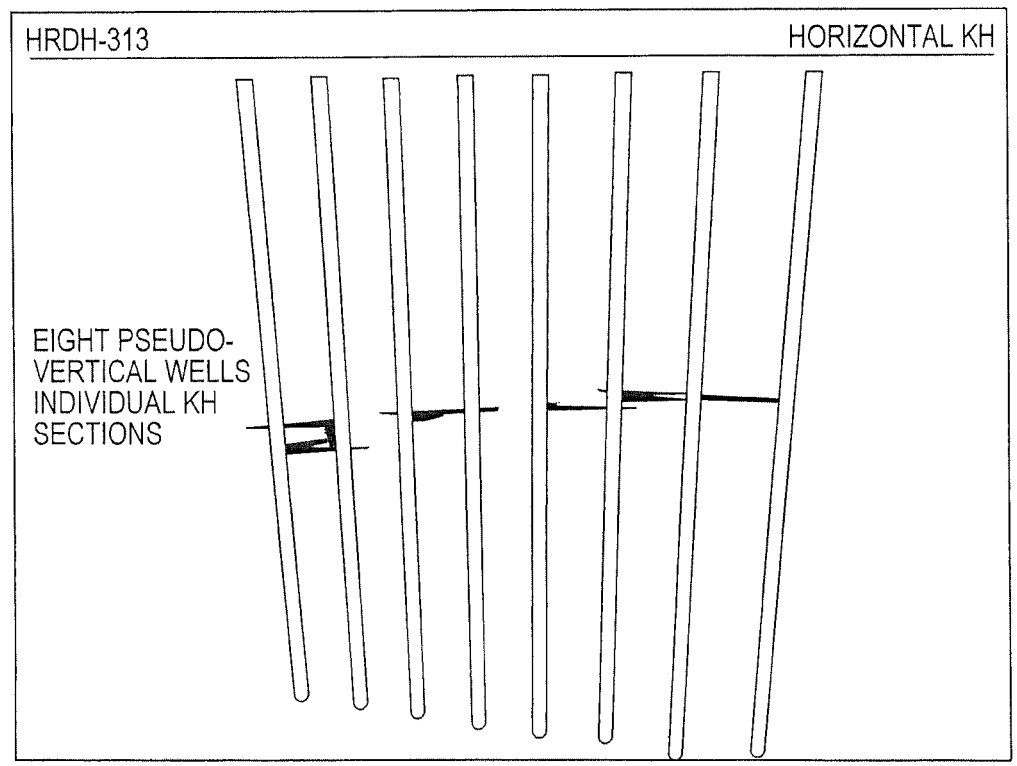
FIG. 11 illustrates KH values where the eight vertical wells of FIG. 4 intersect cells containing the pseudo horizontal well for reservoir HRDH-313.

A second case study was performed on a high-angle slant well identified as HRDH-313. As shown in FIG. 10, eight pseudo-vertical wells were created, each of which passes through one of eight groups of vertically stacked cells (the cells, in turn, representing the cells through which the well trajectory passes). FIG. 11 shows the permeability times cell height determined for the cells through which each vertical pseudo-well passes.

Figure 12:
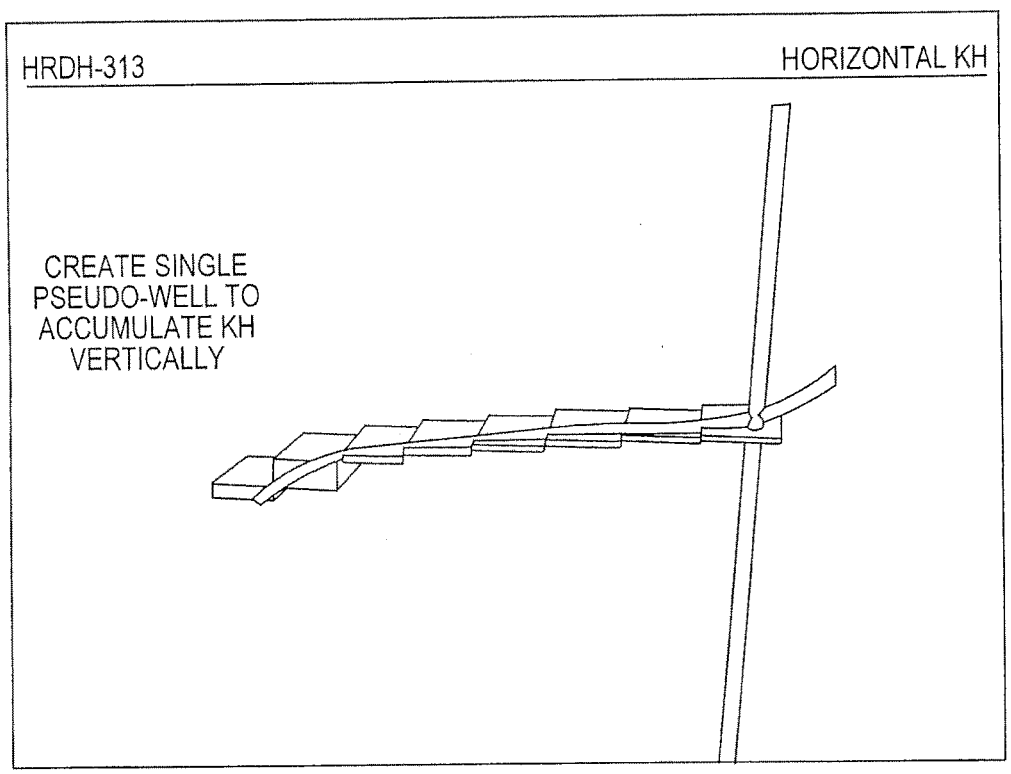
FIG. 12 illustrates a single vertical pseudo well along with cells containing the pseudo horizontal well for reservoir HRDH-313.
Figure 13:
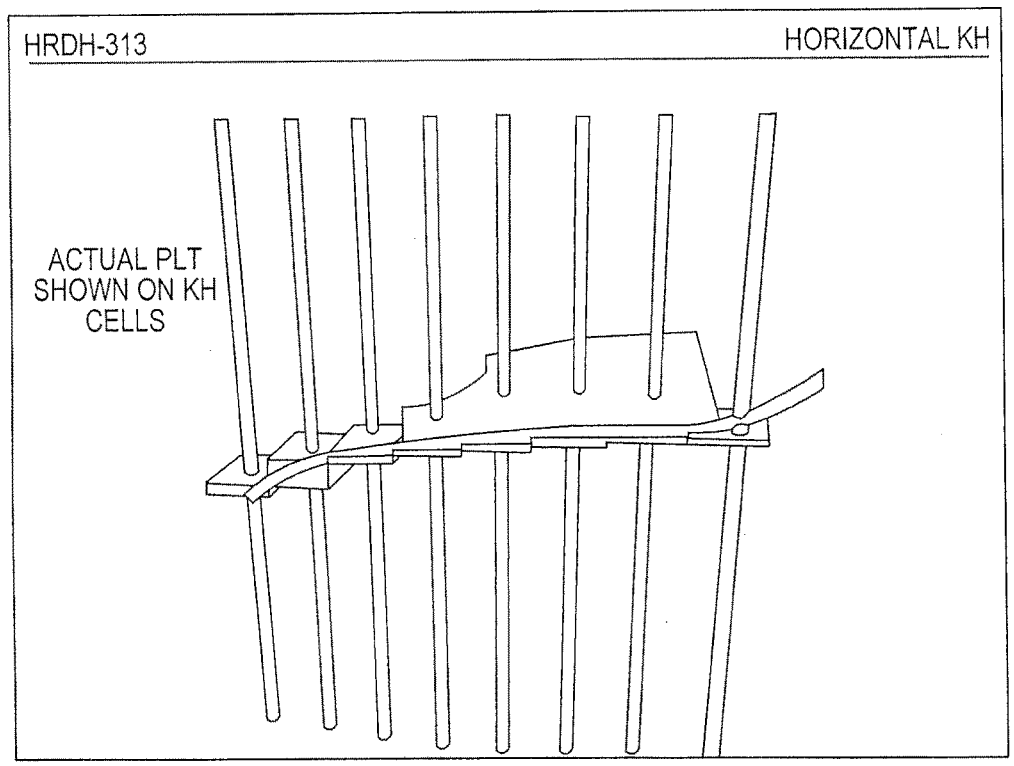
FIG. 13 illustrates results obtained using actual flow meter data along the wellbore trajectory illustrating the abrupt onset of a fourth group of cells for reservoir HRDH-313.

FIGS. 12-13 are similar to FIGS. 7-8.

Figure 14:
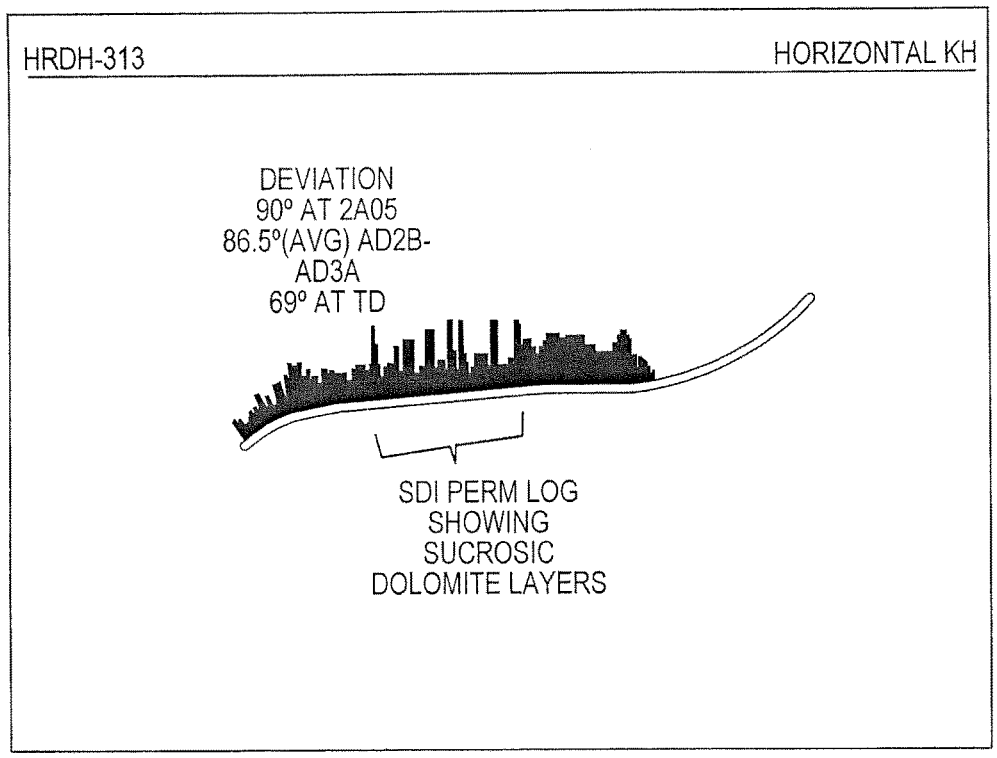
FIG. 14 shows the estimated permeability in the eight pseudo-wells for the 3D cells which intersect the vertical pseudo-wells for reservoir HRDH-313.

FIG. 14 shows the permeability based on sucrosic dolomite is shown along the wellbore for HRDH-313 obtained from production logging tools.

Figure 15:
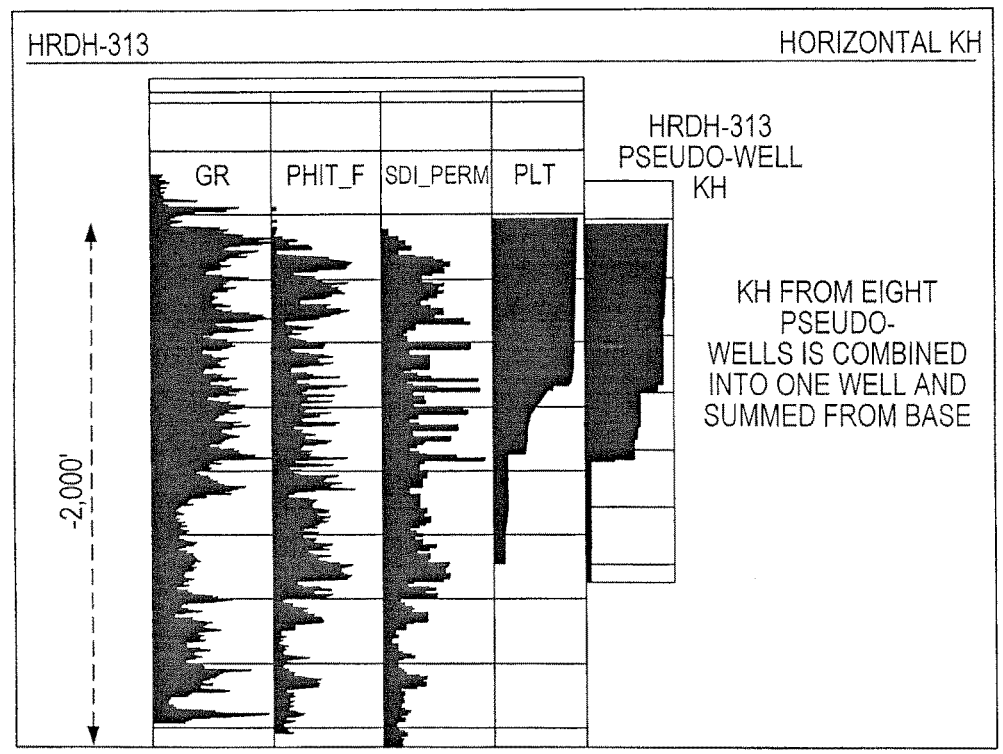
FIG. 15 shows a log which shows permeability as measure by production logging tools (column labeled PLT) next to permeability as predicted using the pseudo-wells (far right) for reservoir HRDH-313.

FIG. 15 is a KH log for reservoir HRDH-313 obtained using production logging tools next to the KH profile obtained using the present invention, where permeability is summed from the base (as in FIG. 3). The calculated profile matches the actual results obtained from production logging tools closely. Note that sucrosic dolomite layers with high permeability (SDI_PERM track) account for the high contribution of production in two intervals.

Figure 16:
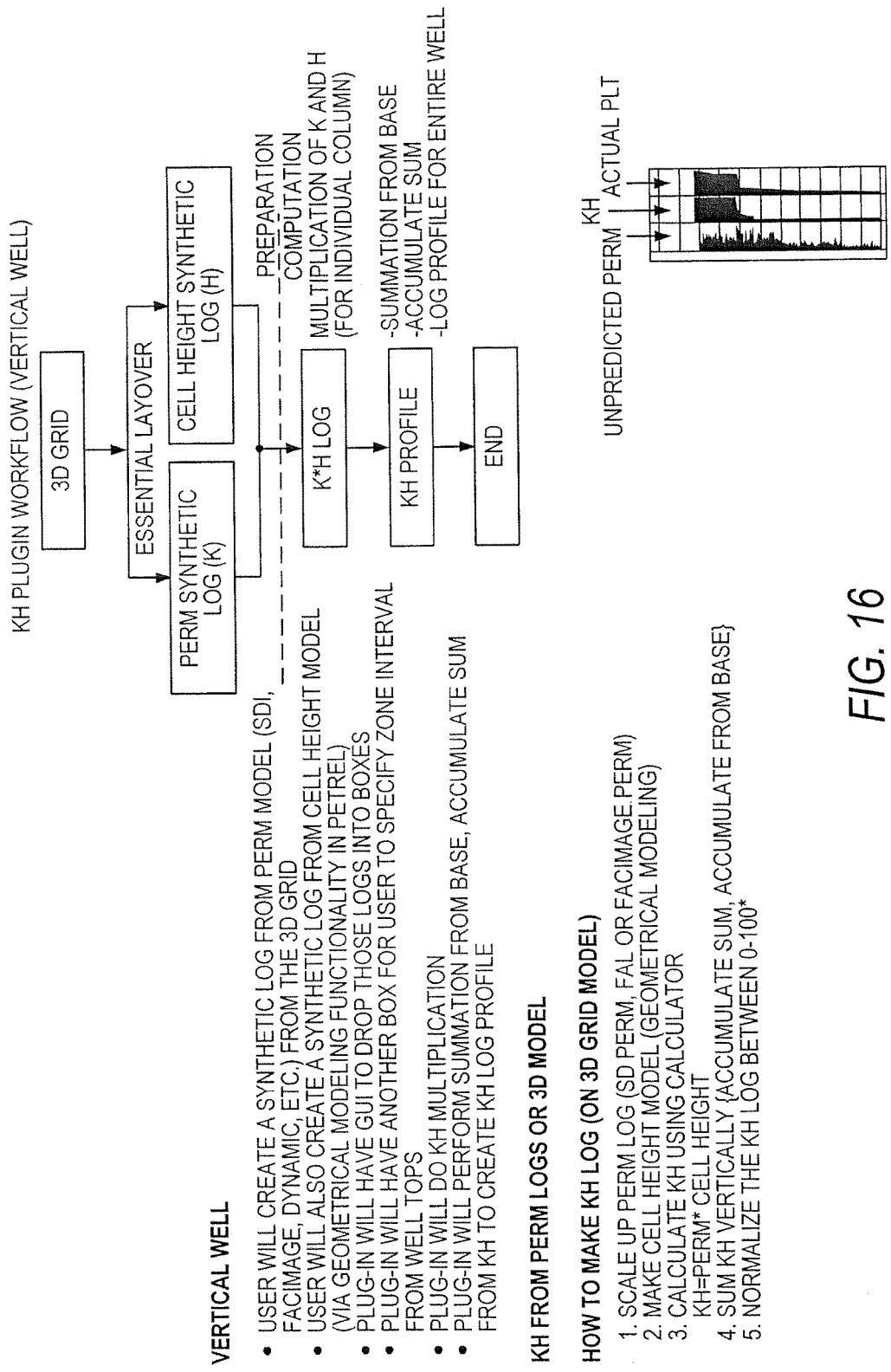
FIG. 16 contains a list of steps, and corresponding illustrations, for creating a property height profile for a vertical well utilizing the invention.

FIG. 16 sets for the workflow for profiling a vertical wellbore. In preparation for the computation, the user needs to create a synthetic log of permeability at various vertical positions (K on the I, J, K grid) from the PERM model created by the Petrel (or other) modeling program (sucrosic dolomite indicator, Facimage, Dynamic, etc. FIG. 16 represents a different method for deriving permeability data for a well and shows that the invention can utilize any form of permeability data provided by the user. The user also needs to create a synthetic log from the Cell Height model (which, in Petrel, is done via the Geometrical Modeling functionality).

Preferably the plug-in application according to the present invention creates a graphic user interface to allow the user to drop both logs into boxes. The plug-in preferably displays another box for the user to specify the zone interval measured from the well tops.

Once these values have been entered, the computer, as programmed by the plug-in app, performs the KH multiplication as described in FIG. 3. The plug-in software will cause the computer to perform a permeability summation from the base algorithm as described, and using the accumulated sum from KH create a KH log profile, an example of which is shown in FIG. 16 (side-by-side with a corresponding profile as measured by production logging tools).

FIG. 15 discloses a method of profiling manually, although such option is not viable for horizontal wells. FIG. 16 also shows computer screens which may be used as part of a manual calculation.

Figure 17:
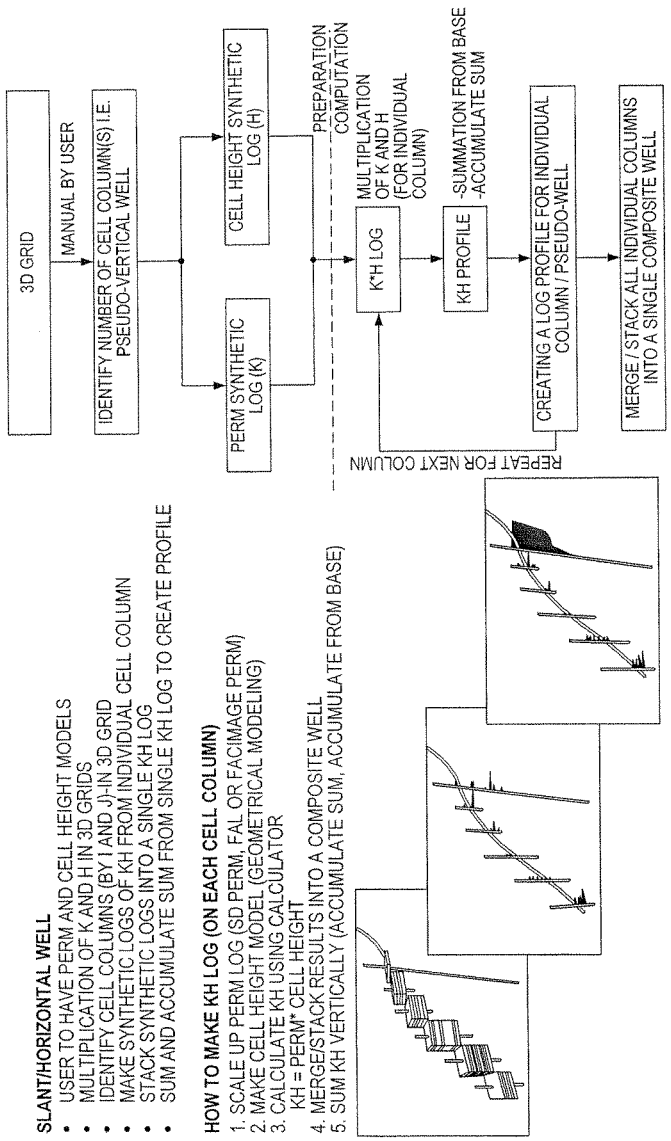
FIG. 17 contains a list of steps, and corresponding illustrations, for creating a property height profile for a horizontal well (which includes slant wells)

FIG. 17 sets for the workflow for profiling a slant/horizontal wellbore. In preparation for the computation, the user needs to create synthetic logs of permeability and cell height at various vertical positions (K on the I, J, K grid) as above. Because multiple pseudo vertical wells need to be created, the user also needs to identify the cell columns in the 3D grid.

Once these values have been entered, the computer performs the procedures described in connection with FIG. 16 for each individual cell column. For manual calculations, the operator needs to enter which cells in each column are intersected by the wellbore, and perform KH only on those cells. In the preferred embodiment of the invention, using a programmed computer, the computer performs those steps automatically. The computer then stacks synthetic logs into a single KH log. In other words, when profiling each vertical pseudo-well, the summation from the base is used to obtain a "calculated cell profile" for each vertical well. Stacking means that the log from the second vertical well is added to the end of the log from the first vertical well, etc. The computer then uses the single KH log to create the profile.

Example 3

Figure 18:
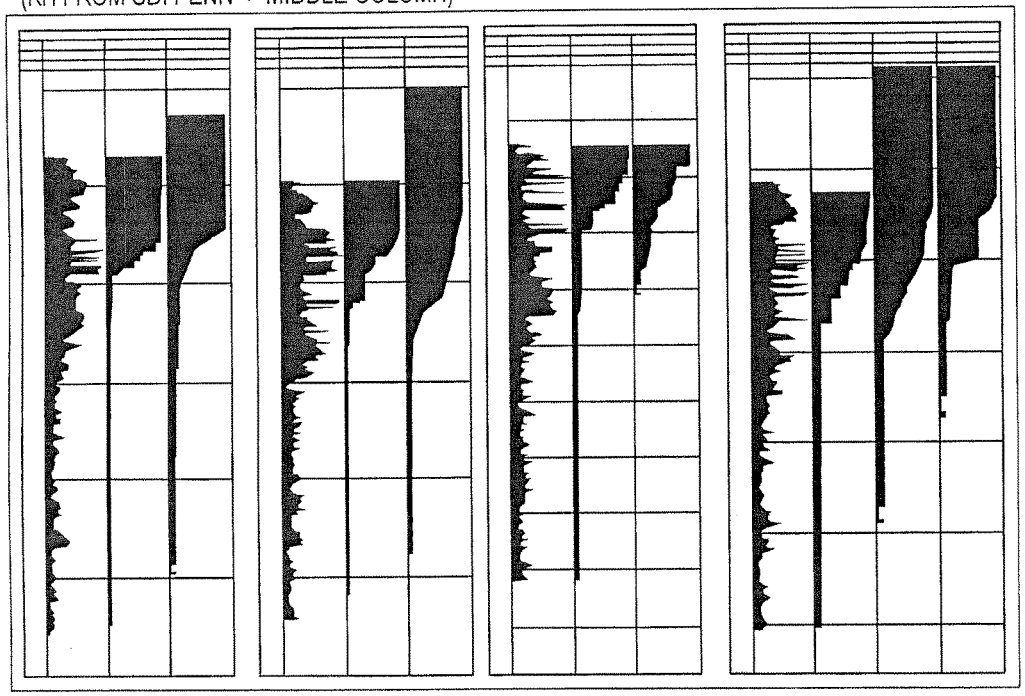
FIG. 18 shows a permeability×height profile as measure by production logging tools versus permeability×height as predicted for four additional wells (3 vertical and one horizontal).

FIG. 18 shows logs for three other vertical wells and one horizontal well where the predicted KH values are compared with an actual flow meter profile. As shown, there is a close match between the property height profile (on the far left in each log) and the actual flow meter profile (on the right in each log).

The KH profile can be created for any number of wells or pseudo-wells in a reservoir. By comparing the profiles created by the system with actual profiles obtained in wells where well testing equipment is available, the model can be adjusted to produce more consistent results. By knowing the KH profile, the user can calculate the appropriate permeability values at certain levels in the well. The user can then reproduce the perm model so that it is more representative of the field flow from the measured wells. The pseudo-well profiles may thus be populated/distributed in a 3D space model to predict KH away from the well trajectory and create a KH model.

The invention claimed is:

1. A computer-implemented system, comprising:
   a computer memory; and
   a hardware processor interoperably coupled with the computer memory and configured to perform operations comprising:
   defining a three-dimensional (3D) grid of cells for a reservoir, wherein each cell has a defined length, width, and vertical height;
   defining a trajectory of a horizontal wellbore or a slant wellbore within the grid;
   determining each cell of the 3D grid of cells that intersect the trajectory of the horizontal wellbore or the slant wellbore;
   identifying a plurality of horizontally adjacent vertical pseudo-wells, wherein each horizontally adjacent vertical pseudo-well comprises a cell column of vertically stacked cells at a particular horizontal coordinate through which the trajectory of the horizontal wellbore or the slant wellbore intersects;
   for each pseudo-well of the identified horizontally adjacent vertical pseudo-wells, generating a property-height profile of a property associated with the pseudo-well by:
   for each particular cell of the cell column associated with the pseudo-well:
   calculating a property thickness value of the property for the particular cell, wherein the property thickness value is a product of a value of the property associated with the particular cell and the defined vertical height of the particular cell; and
   calculating a current cell profile for the particular cell, wherein the current cell profile is a sum of the calculated property thickness value of the particular cell and an accumulated sum of the property value summed upward from the lowest cell of the cell column to the particular cell.

2. The computer-implemented system of claim 1, further configured to use the property-height profiles from a plurality of pseudo-wells to populate a 3D space model to predict property-height values away from the trajectory of the horizontal wellbore or the slant wellbore.

3. A non-transitory, computer-readable medium storing one or more instructions executable by a computer system to perform operations comprising:
   defining a three-dimensional (3D) grid of cells for a reservoir, wherein each cell has a defined length, width, and vertical height;
   defining a trajectory of a horizontal wellbore or a slant wellbore within the grid;
   determining each cell of the 3D grid of cells that intersect the trajectory of the horizontal wellbore or the slant wellbore;
   identifying a plurality of horizontally adjacent vertical pseudo-wells, wherein each horizontally adjacent vertical pseudo-well comprises a cell column of vertically stacked cells at a particular horizontal coordinate through which the trajectory of the horizontal wellbore or the slant wellbore intersects;
   for each pseudo-well of the identified horizontally adjacent vertical pseudo-wells, generating a property-height profile of a property associated with the pseudo-well by:
   for each particular cell of the cell column associated with the pseudo-well:
   calculating a property thickness value of the property for the particular cell, wherein the property thickness value is a product of a value of the property associated with the particular cell and the defined vertical height of the particular cell; and
   calculating a current cell profile for the particular cell, wherein the current cell profile is a sum of the calculated property thickness value of the particular cell and an accumulated sum of the property value summed upward from the lowest cell of the cell column to the particular cell.

4. The non-transitory, computer-readable medium of claim 3, further comprising one or more instructions to use the property-height profiles from a plurality of pseudo-wells to populate a 3D space model to predict property-height values away from the trajectory of the horizontal wellbore or the slant wellbore.

5. A computer-implemented method, comprising:
- defining a three-dimensional (3D) grid of cells for a reservoir, wherein each cell has a defined length, width, and vertical height;
- defining a trajectory of a horizontal wellbore or a slant wellbore within the grid;
- determining each cell of the 3D grid of cells that intersect the trajectory of the horizontal wellbore or the slant wellbore;
- identifying a plurality of horizontally adjacent vertical pseudo-wells, wherein each horizontally adjacent vertical pseudo-well comprises a cell column of vertically stacked cells at a particular horizontal coordinate through which the trajectory of the horizontal wellbore or the slant wellbore intersects;
- for each pseudo-well of the identified horizontally adjacent vertical pseudo-wells, generating a property-height profile of a property associated with the pseudo-well by:
  - for each particular cell of the cell column associated with the pseudo-well:
    - calculating a property thickness value of the property for the particular cell, wherein the property thickness value is a product of a value of the property associated with the particular cell and the defined vertical height of the particular cell; and
    - calculating a current cell profile for the particular cell, wherein the current cell profile is a sum of the calculated property thickness value of the particular cell and an accumulated sum of the property value summed upward from the lowest cell of the cell column to the particular cell.

6. The computer-implemented method of claim 5, further comprising using the property-height profiles from a plurality of pseudo-wells to populate a 3D space model to predict property-height values away from the trajectory of the horizontal wellbore or the slant wellbore.

* * * * *